United States Patent
Ibaraki et al.

(10) Patent No.: US 7,191,491 B2
(45) Date of Patent: Mar. 20, 2007

(54) HINGE CONNECTOR HAVING A SHAFT MEMBER OF A SIMPLE STRUCTURE AND ELECTRONIC APPARATUS INCLUDING THE HINGE CONNECTOR

(75) Inventors: Kazuaki Ibaraki, Tokyo (JP); Masao Higuchi, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 11/215,325

(22) Filed: Aug. 30, 2005

(65) Prior Publication Data

US 2006/0053591 A1   Mar. 16, 2006

(30) Foreign Application Priority Data

Aug. 30, 2004   (JP) .............................. 2004-250431

(51) Int. Cl.
*E05D 3/10* (2006.01)
*E05F 1/08* (2006.01)
(52) U.S. Cl. .......................................... 16/367; 16/286
(58) Field of Classification Search ............... 16/367, 16/330, 303, 285–287, 280; 455/575.1, 575.3; 379/433.13, 434; 361/683, 803; 439/165
See application file for complete search history.

(56) References Cited

U.S. PATENT DOCUMENTS

| | | | | |
|---|---|---|---|---|
| 5,574,252 A | * | 11/1996 | Hill | 174/51 |
| 5,978,210 A | * | 11/1999 | McCrary | 361/680 |
| 6,532,628 B2 | * | 3/2003 | Kim | 16/342 |
| 6,698,063 B2 | * | 3/2004 | Kim et al. | 16/337 |
| 6,798,646 B2 | * | 9/2004 | Hsu | 361/681 |
| 2002/0080548 A1 | | 6/2002 | Kato et al. | |

FOREIGN PATENT DOCUMENTS

| | | |
|---|---|---|
| EP | 1 313 358 A2 | 5/2003 |
| EP | 1 403 753 A2 | 3/2004 |
| EP | 1 427 174 A2 | 6/2004 |
| JP | 2001-327902 | 10/2001 |
| JP | 2003120654 | 4/2003 |
| JP | 2003133764 A * | 5/2003 |
| JP | 2003-133764 | 9/2003 |
| JP | 2004084756 | 3/2004 |

\* cited by examiner

*Primary Examiner*—Chuck Y. Mah
(74) *Attorney, Agent, or Firm*—Collard & Roe, P.C.

(57) ABSTRACT

In a hinge connector including a shaft member and a flexible board coupled thereto, the shaft member has a first shaft extending in a first direction and a second shaft extending from the first shaft in a second direction perpendicular to the first direction. The flexible board has first and second winding portions which are wound around the first and the second shafts, respectively.

4 Claims, 9 Drawing Sheets

HINGE CONNECTOR HAVING A SHAFT MEMBER OF A SIMPLE STRUCTURE AND ELECTRONIC APPARATUS INCLUDING THE HINGE CONNECTOR

This application claims priority to prior Japanese patent application JP 2004-250431, the disclosure of which is incorporated herein by reference.

BACKGROUND OF THE INVENTION

This invention relates to a hinge connector having a flexible board and to an electronic apparatus including the hinge connector.

For example, Japanese Unexamined Patent Application Publication (JP-A) No. 2003-133764 discloses a foldable mobile telephone (flip phone) as an example of an electronic apparatus. The mobile telephone comprises a first housing having a display portion, a second housing having a numeric keypad portion, and a flexible board extending between the first and the second housings. The mobile telephone further includes a two-axis hinge mechanism by which the first and the second housings are coupled to each other to be rotatable with respect to each other. The two-axis hinge mechanism has a main body and three hinges attached to the main-body. Two of the hinges are disposed along a first axis and spaced from each other. The remaining hinge is disposed along a second axis perpendicular to the first axis. The flexible board is wound around one of the two hinges disposed along the first axis and around the hinge disposed along the second axis.

The above-mentioned electronic apparatus is disadvantageous in the following respects. Since the two-axis hinge mechanism has a complicated structure, an assembling operation is troublesome. In addition, the two-axis hinge mechanism and the flexible board are separately prepared and, upon assembling the electronic apparatus, the flexible board is wound around the two-axis hinge mechanism to be mounted. Thus, a cumbersome procedure is inevitably required.

SUMMARY OF THE INVENTION

It is therefore an object of this invention to provide a hinge connector which is simple in structure and capable of improving an assemblability of an apparatus.

It is another object of this invention to provide an electronic apparatus having the above-mentioned hinge connector.

Other objects of the present invention will become clear as the description proceeds.

According to an aspect of the present invention, there is provided a hinge connector comprising a shaft member and a flexible board coupled to the shaft member, the shaft member comprising a first shaft extending in a first direction and a second shaft extending from the first shaft in a second direction perpendicular to the first direction, the flexible board having first and second winding portions which are wound around the first and the second shafts, respectively.

DESCRIPTION OF THE PREFERRED EMBODIMENTS

Figure 1:
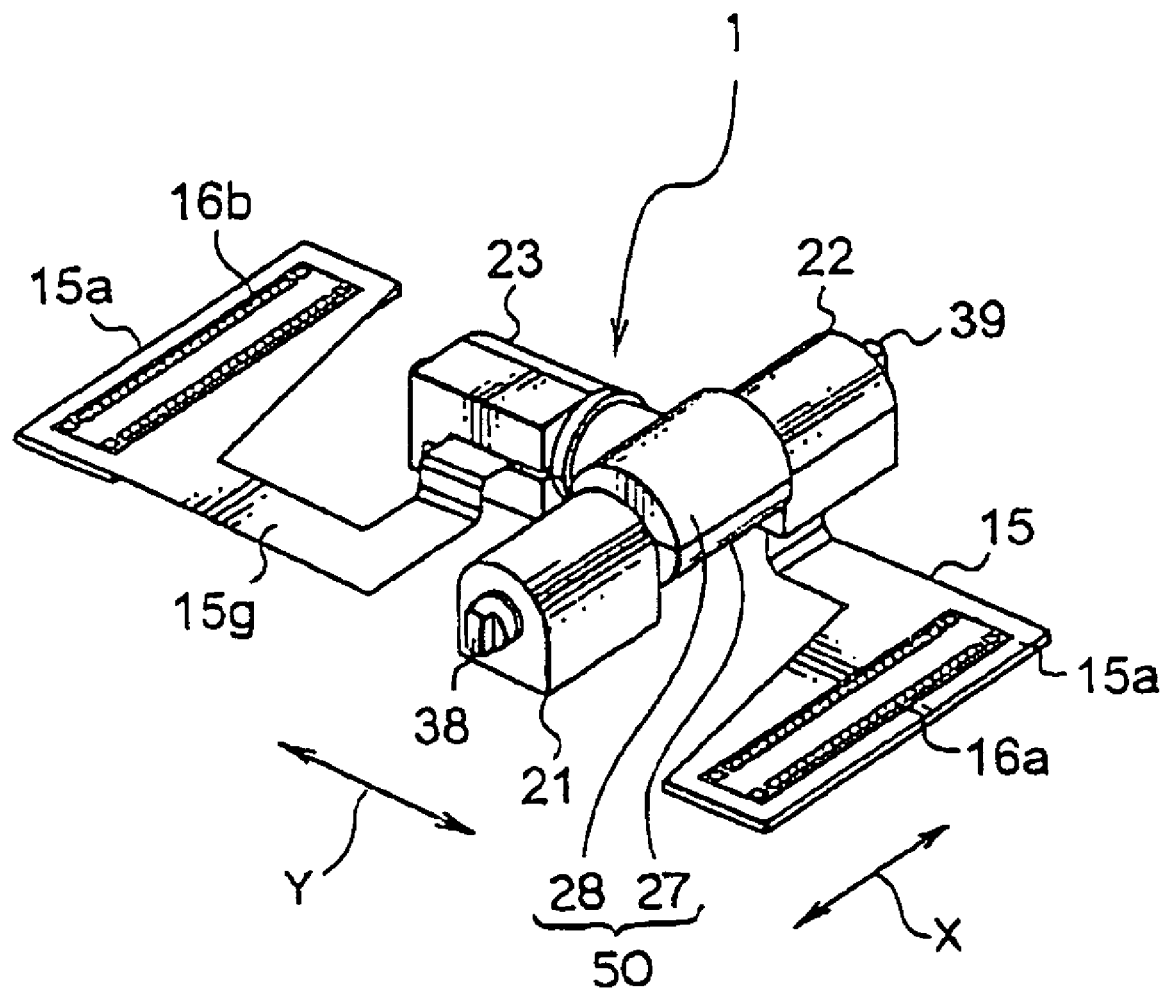
FIG. 1 is a perspective view of a hinge connector according to an embodiment of this invention.
Figure 2:
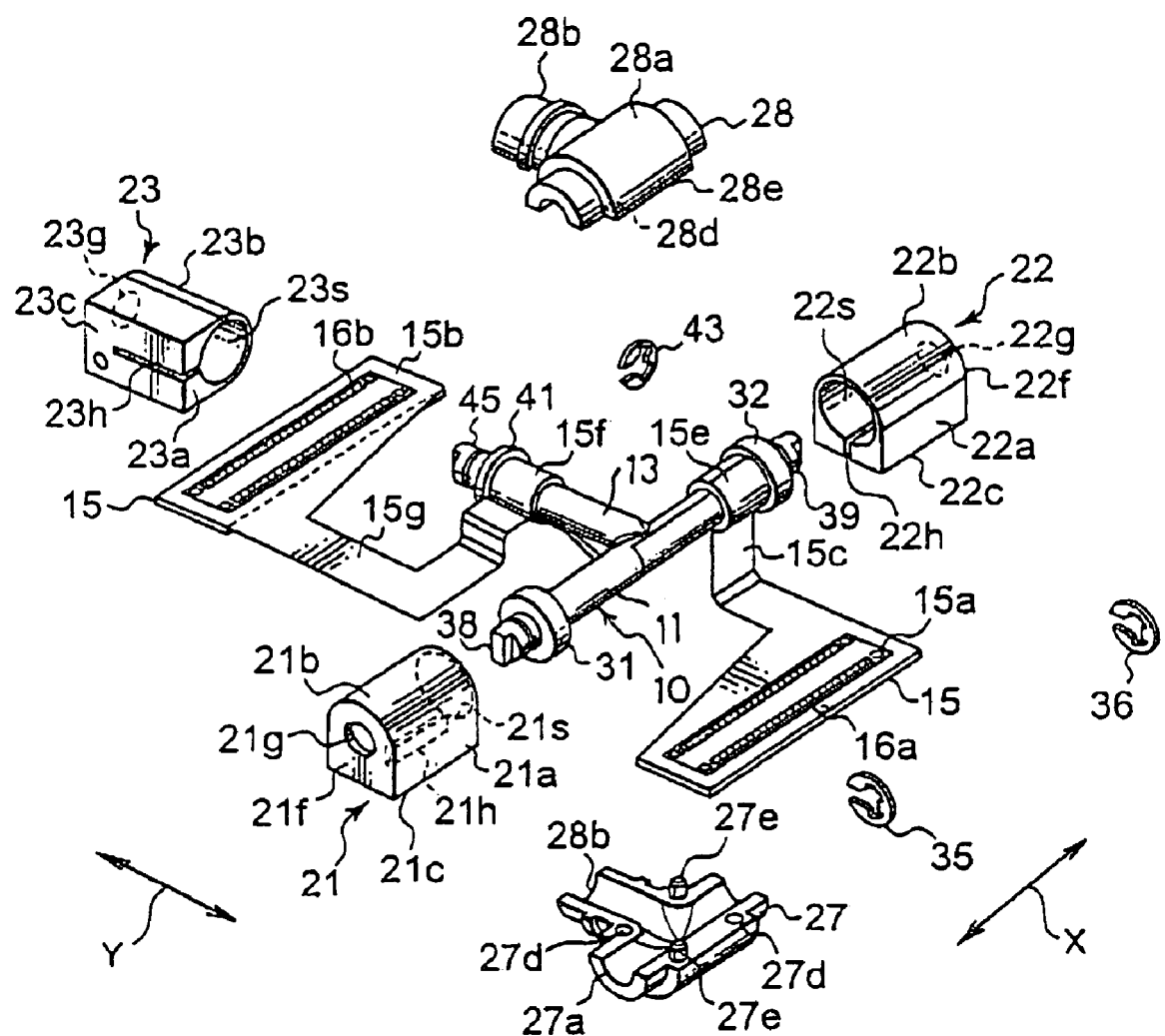
FIG. 2 is an exploded perspective view of the hinge connector illustrated in FIG. 1.

Referring to FIGS. 1 and 2, a hinge connector according to an embodiment of this invention will be described.

The hinge connector 1 illustrated in the figures comprises a first shaft 11 extending in a first direction X, a second shaft 13 extending in a second direction Y perpendicular to the first direction X and connected to the first shaft 11, a flexible board 15 having an intermediate portion wound around the first and the second shafts 11 and 13, first through third holding members 21, 22, and 23 held by the first and the second shaft 11 and 13 integrally therewith, and a pair of cover components 27 and 28 rotatably holding each of the first through the third holding members 21, 22, and 23. A combination of the first and the second shaft 11 and 13 is referred to as a shaft member 10. A combination of the cover components 27 and 28 will be referred to as a cover member 50.

Figure 3:
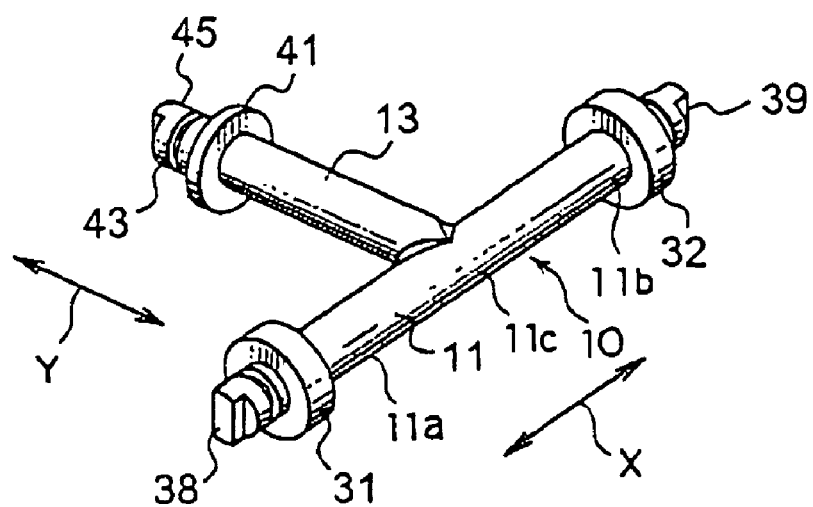
FIG. 3 is a perspective view of a shaft member in the hinge connector illustrated in FIG. 1.

As illustrated in FIG. 3 also, a combination of the first and the second shafts 11 and 13 forms an integral shaft member of a generally T shape in plan view. The first shaft 11 has first and second flange portions 31 and 32 formed at opposite ends 11a and 11b thereof in the first direction X to hold the first and the second holding members 21 and 22 and the cover components 27 and 28. On the outside of the first and the second flange portions 31 and 32, a pair of stopper rings 35 and 36 of a generally E shape are attached, respectively. On the outside of the stopper rings 35 and 36, first and second stoppers 38 and 39 are disposed.

Figure 4:
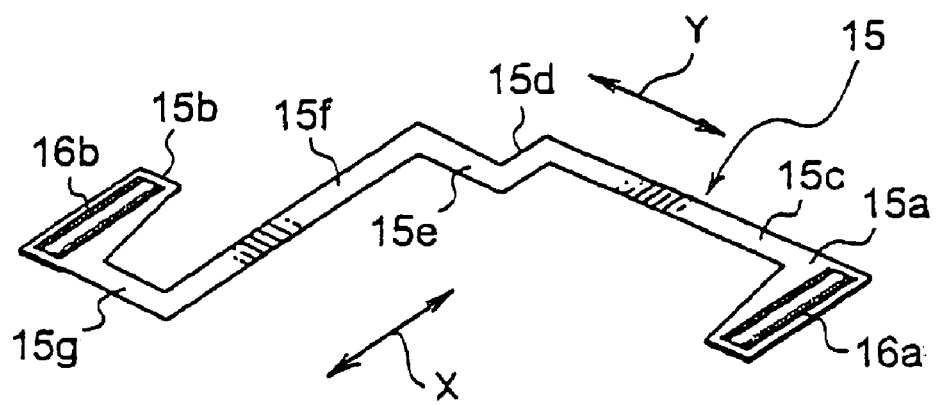
FIG. 4 is a perspective view of a flexible board in the hinge connector illustrated in FIG. 1.

The second shaft 13 has one end connected to an intermediate portion 11c of the first shaft 11 in the first direction X. The second shaft 13 has a third flange portion 41 formed at its end portion in the second direction Y to hold the third holding member 23. On the outside of the third flange portion 41, a stopper ring 43 of a generally E shape is attached, respectively. On the outside of the stopper ring 43, a third stopper 45 is disposed As illustrated in FIG. 4 also, the flexible board 15 comprises a conductor pattern interposed between film members. The flexible board 15 used in this embodiment is generally called a flexible printed circuit (FPC), which is an example of various flexible electric circuit boards.

The flexible board 15 has a first connecting portion 15a formed at its one end, a second connecting portion 15b formed at the other end, a first intermediate portion 15c extending from the first connecting portion 15a in the second direction Y, and a second intermediate portion 15d extending from the first intermediate portion 15c in the first direction X.

Further, the flexible board 15 has a third intermediate portion 15e extending from the second intermediate portion 15d in the second direction Y, a fourth intermediate portion 15f extending from the third intermediate portion 15e in the first direction X, and a fifth intermediate portion 15g extending from the fourth intermediate portion 15f in the first direction X and connected to the second connecting portion 15b.

In plan view, the first through the fifth intermediate portions 15c to 15g form a generally crank-like shape bent between the first and the second connecting portions 15a and 15b. The first connecting portion 15a has one surface provided with a conductive pad 16a adapted to receive a connector which is mounted thereon and connected thereto and which is connected also to a mating connector mounted to an apparatus (not shown). The second connecting portion 15b has one surface provided with a conductive pad 16b adapted to receive a connector which is mounted thereon and connected thereto and which is connected also to a mating connector mounted to an apparatus (not shown).

The second and the third intermediate portions 15d and 15e are wound around the first shaft 11 inside the first and the second flange portions 31 and 32 and near the second flange portion 32. The fourth intermediate portion 15f is wound around the second shaft 13 near the third flange portion 41.

Turning back to FIGS. 1 and 2, the first through the third holding members 21, 22, and 23 are same in shape as one another. The first through the third holding members 21, 22, and 23 have base portions 21a; 22a, and 23a and cylindrical portions 21b, 22b, and 23b integral with the base portions 21a, 22a, and 23a, respectively.

The base portions 21a, 22a, and 23a have flat bottom surfaces 21c, 22c, and 23c, respectively. The cylindrical portions 21b, 22b, and 23b have one ends and internal portions which form cylindrical spaces 21s, 22s, and 23s slightly greater than outer peripheral dimensions of the first through the third flange portions 31, 32, and 41, respectively. The cylindrical portions 21b, 22b, and 23b have the other ends as closed portions 21f, 22f, and 23f, respectively. The closed portions 21f, 22f, and 23f are provided with holes 21g, 22g, and 23g slightly smaller than external dimensions of the first and the second shafts 11 and 13.

The first through the third holding members 21, 22, and 23 are provided with slits 21h, 22h, and 23h to allow the flexible board 15 to pass through the bottom surfaces 21c, 22c, and 23c into the spaces 21s, 22s, and 23s.

Thus, in the first through the third holding members 21, 22, and 23, the second through the fourth intermediate portions 15d, 15e, and 15f wound around the first and the second shafts 11 and 13 as well as the first through the third flange portions 31, 32, and 41 are included in the cylindrical spaces 21s, 22s, and 23s, respectively. Through the slits 21h, 22h, and 23h, parts of the second through the fourth intermediate portions 15d, 15e, and 15f are inserted, respectively.

The stoppers 38, 39, and 45 are engaged with the first and the second shafts 11 and 13 via the stopper rings 35, 36, and 43 and through the holes 21g, 22g, and 23g. Thus, the first through the third holding members 21, 22, and 23 are rotatably held by the first and the second shafts 11 and 13 in a state such that the cover components 27 and 28 are inhibited from movement in the first and the second directions X and Y.

The cover components 27 and 28 have first cover portions 27a and 27b of a semi-cylindrical shape covering the first shaft 11 from upper and lower sides at a position connected to the second shaft 13, and second cover portions 28a and 28b of a semi-cylindrical shape covering the second shaft 13 from upper and lower sides at a position connected to the first shaft 11. The cover components 27 and 28 are faced to each other at mating surfaces of the first cover portions 27a and 27b. The mating surfaces are provided with a plurality of recessed portions 27d and 28d and a plurality of protruding portions 27e and 28e.

The cover components 27 and 28 are attached to a connecting portion of the first and the second shafts 11 and 13 to sandwich the connecting portion from upper and lower sides with the recessed portions 27d and 28d and the protruding portions 27e and 28e being fitted to each other.

Now, referring to FIGS. 5 through 7, description will be made of an assembling operation of the above-mentioned components of the hinge connector.

Figure 5:
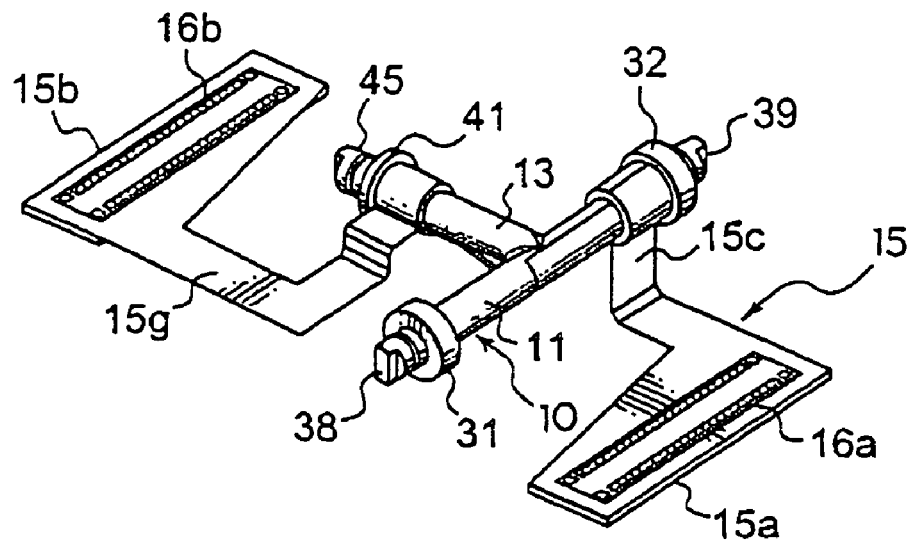
FIGS. 5 to 7 are perspective views for describing assembling steps of the hinge connector illustrated in FIG. 1.

As illustrated in FIG. 5, the second and the third intermediate portions 15d and 15e of the flexible board 15 are wound around the first shaft 11. The fourth intermediate portion 15f is wound around the second shaft 13. The second through the fourth intermediate portions 15d, 15e, and 15f of the flexible board 15 are wound around the first and the second shaft 11 and 13 in a single turn of a plurality of turns and fixed by a double-sided adhesive tape.

Figure 6:
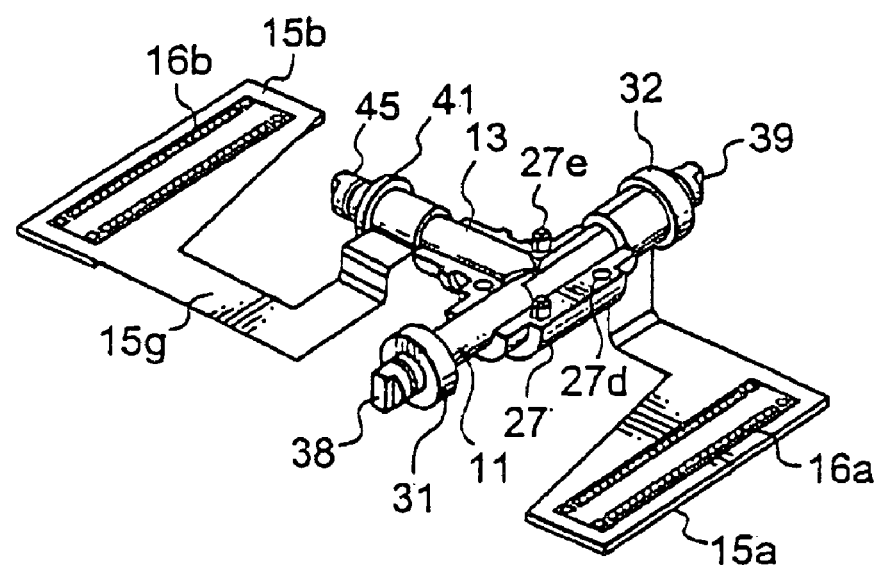
Figure 7:
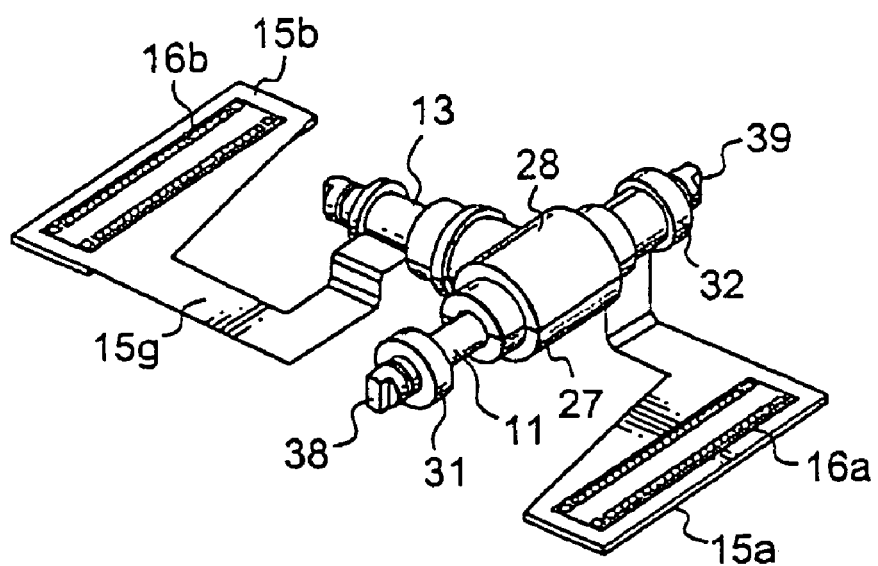

Next referring to FIGS. 6 and 7, the cover components 27 and 28 are attached to the connecting portion of the first and the second shaft 11 and 13. In this event, the recessed portions 27d and 28d and the protruding portions 27e and 28e of the cover components 27 and 28 are fitted to each other.

The first through the third holding members 21, 22, and 23 are attached to the first and the second shafts 11 and 13. At this time, the second through the fourth intermediate portions 15d, 15e, and 15f wound around the first and the second shafts 11 and 13 as well as the first through the third flange portions 31, 32, and 41 are disposed in the cylindrical spaces 21s, 22s, and 23s. Parts of the second through the fourth intermediate portions 15d, 15e, and 15f are inserted through the slits 21h, 22h, and 23h, respectively.

The stoppers 38, 39, and 45 of the first and the second shafts 11 are 13 are inserted through the holes 21g, 22g, and 23g. Further, the stopper rings 35, 36, and 43 are attached to the stoppers 38, 39, and 45 from the outside to engage the first through the third holding members 21, 22, and 23 with the first and the second shafts 11 and 13.

In the hinge connector assembled in the above-mentioned manner, the first through the third holding members 21, 22, and 23 are rotatable with respect to the first and the second shafts 11 and 13. The cover components 27 and 28 are held on the first and the second shafts 11 and 13 by the first through the third holding members 21, 22, and 23.

With the hinge connector mentioned above, it is possible to improve an assemblability to the apparatus and an electric shieldability because the flexible board to be electrically connected is contained in the holding members.

Figure 8:
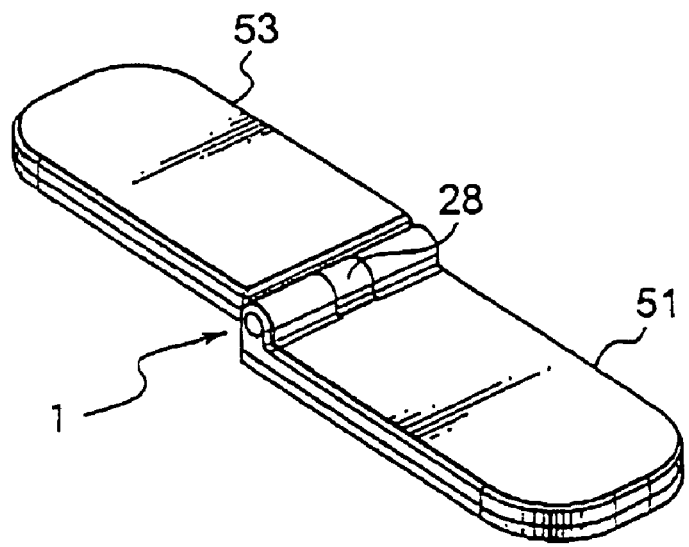
FIG. 8 is a perspective view of an electronic apparatus having the hinge connector illustrated in FIG. 1.
Figure 9:
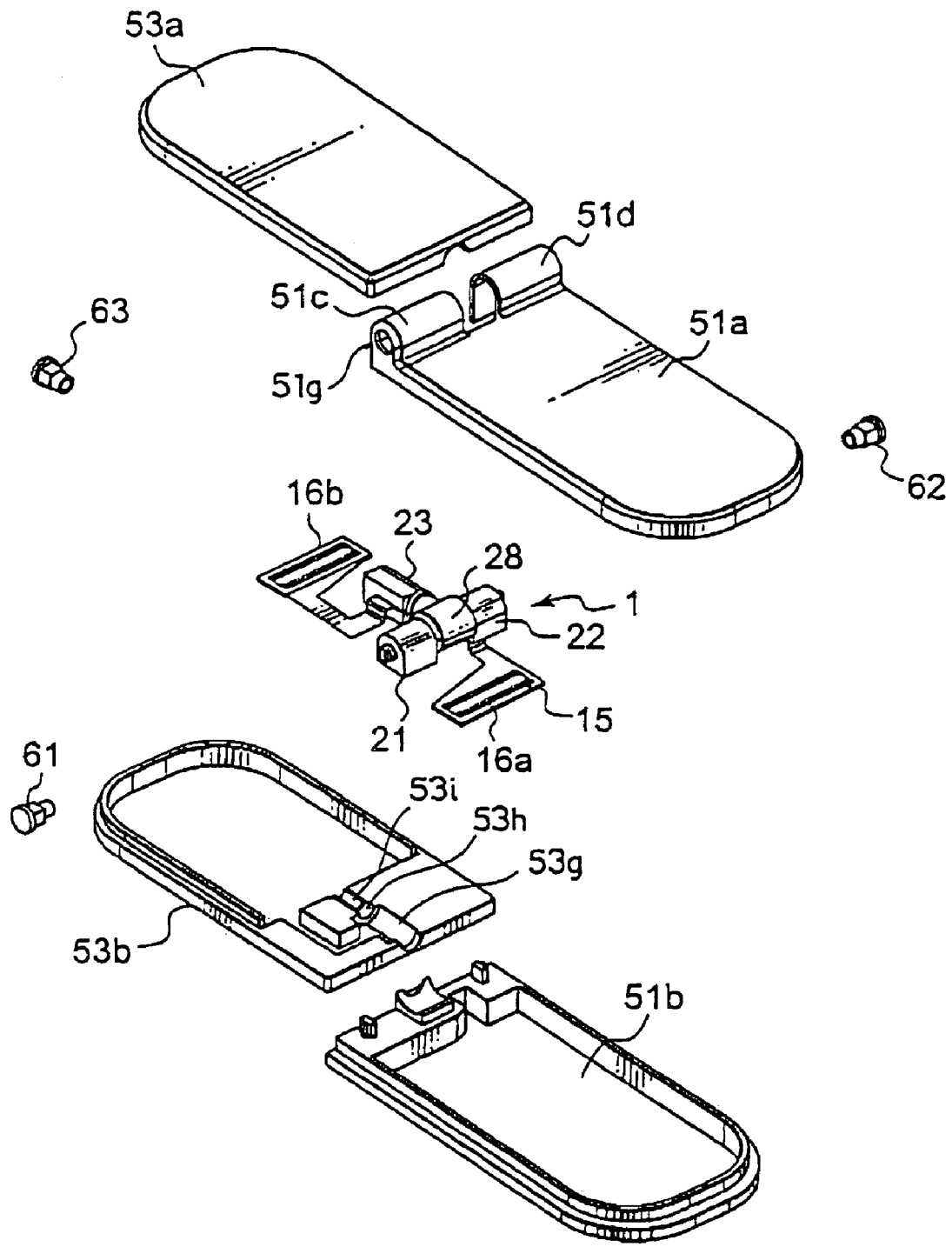
FIG. 9 is an exploded perspective view of the electronic apparatus illustrated in FIG. 8.

Referring to FIGS. 8 and 9, description will be made of a foldable electronic apparatus using the above-mentioned hinge connector 1.

The electronic apparatus comprises a first housing 51, a second housing 53, and a hinge mechanism hinge-coupling the first and the second housings 51 and 53.

The first housing 51 has a first upper case 51a and a first lower case 51b combined with the first upper case 51a. The second housing 53 has a second upper case 53a and a second lower case 53b combined with the second upper case 53a.

The first upper case 51a is provided with a cylindrical first case holding portion 51c adapted to receive the first holding member 21 of the hinge connector 1, and a groove-like second case holding portion 51d adapted to receive the second holding member 22. The first and the second case holding portions 51c and 51d have a structure such that the first and the second holding members 21 and 22 are not rotated when the first and the second holding members 21 and 22 are received therein. The hinge mechanism is formed by the hinge connector 1 and the first and the second case holding portions 51c and 51d.

The first case holding portion 51c has a rotation stopper (not shown) for inhibiting rotation of the hinge connector 1 and a hole 51g to receive an end portion of the first shaft 11. The second lower case 53b is provided with a groove 53g adapted to receive the second shaft 13 of the hinge connector 1. The groove 53g has a rotation stopper 53h for inhibiting rotation of the hinge connector 1 and a groove 53i allowing an end of the second shaft 13 to pass therethrough.

Figure 10:
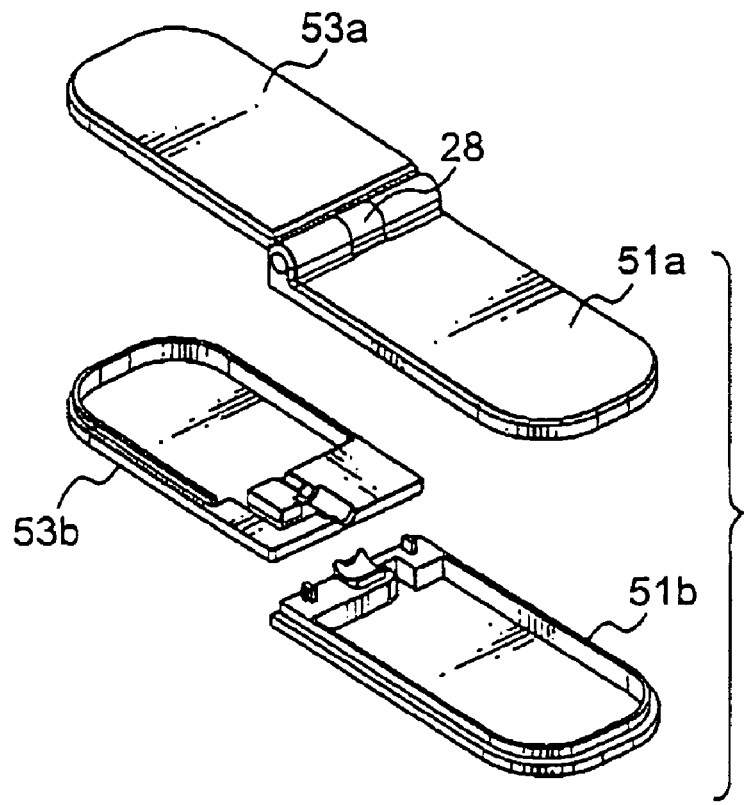
FIG. 10 is an exploded perspective view of a housing member in the electronic apparatus illustrated in FIG. 8.

As illustrated in FIG. 10, a half of the first shaft 11 of the hinge connector 1 with the first holding member 21 held thereon is inserted into the first case holding portion 51c of the first upper case 51a. The other half of the first shaft 11 of the hinge connector 1 with the second holding member 22 held thereon is inserted into the second case holding portion 51d. The second shaft 13 holding the third holding member 23 is inserted into a groove of the second upper case 53a.

The opposite ends of the flexible board 15 are connected to a circuit board (not shown) preliminarily fixed to the first and the second upper cases 51a and 53a directly or through the hinge connector 1. The first and the second lower cases 51b and 53b to serve as covers are put on the first and the second upper cases 51a and 53a.

To the first and the second case holding portions 51c and 51d, mechanical parts 61, 62, and 63 illustrated in FIG. 9 and called dampers are inserted into the stoppers 38, 39, and 45 at the opposite ends of the first shaft 11 and at the end of the second shaft 13 to hold the hinge connector 1.

Figure 11:
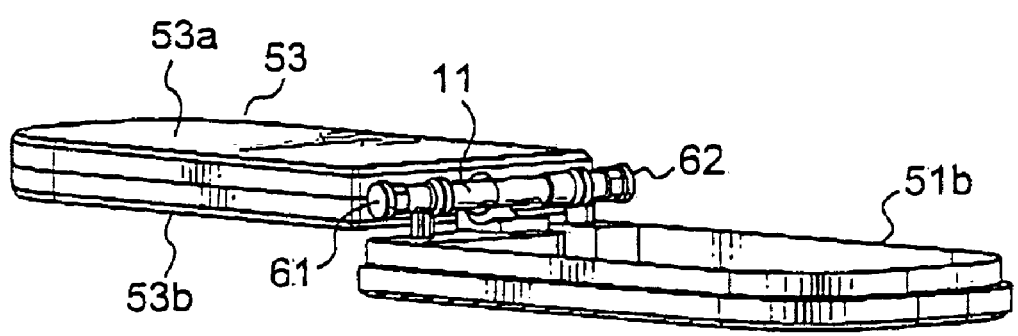
FIG. 11 is a perspective view showing an assembled state of the housing member illustrated in FIG. 10.
Figure 12:
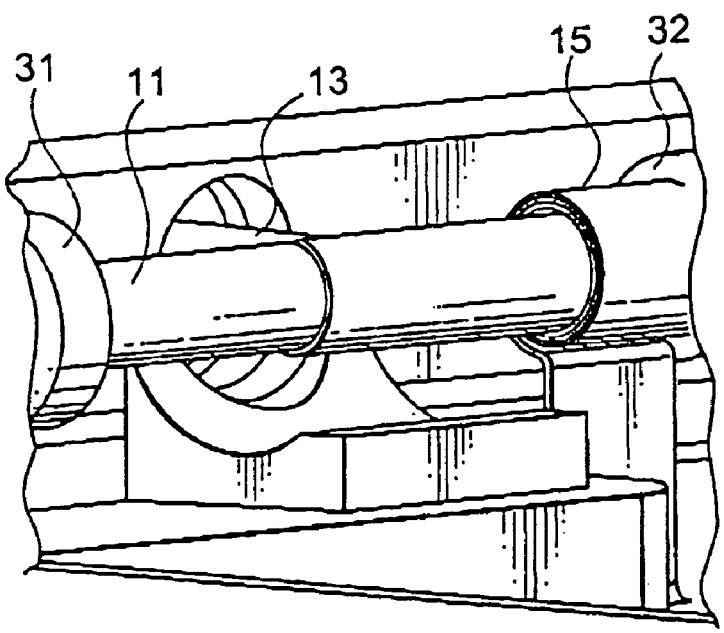
FIG. 12 is an enlarged perspective view of a characteristic part in FIG. 11.

Referring to FIGS. 11 and 12, the first lowercase 51b and the second case 53 are attached to the first shaft. In addition, the mechanical parts 61 and 62 are attached to the first shaft 11. The flexible board 15 is wound around the first shaft 11.

Figure 13:
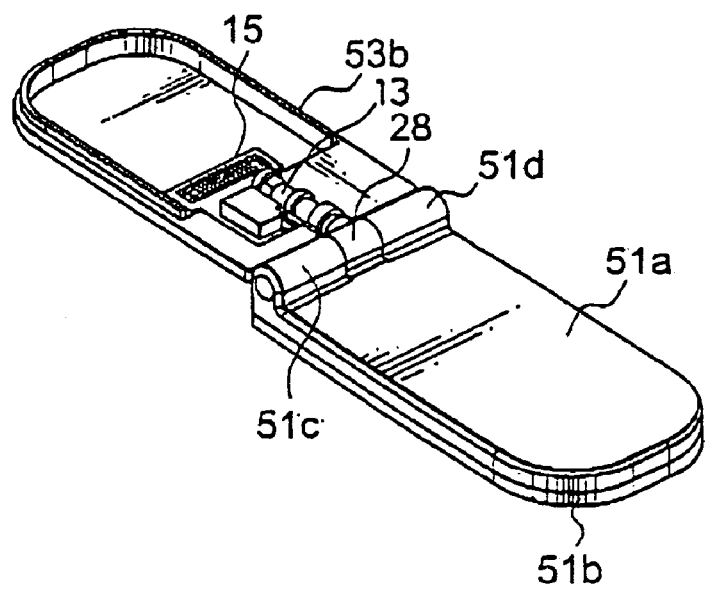
FIG. 13 is a perspective view showing another assembled state of the housing member illustrated in FIG. 10.
Figure 14:
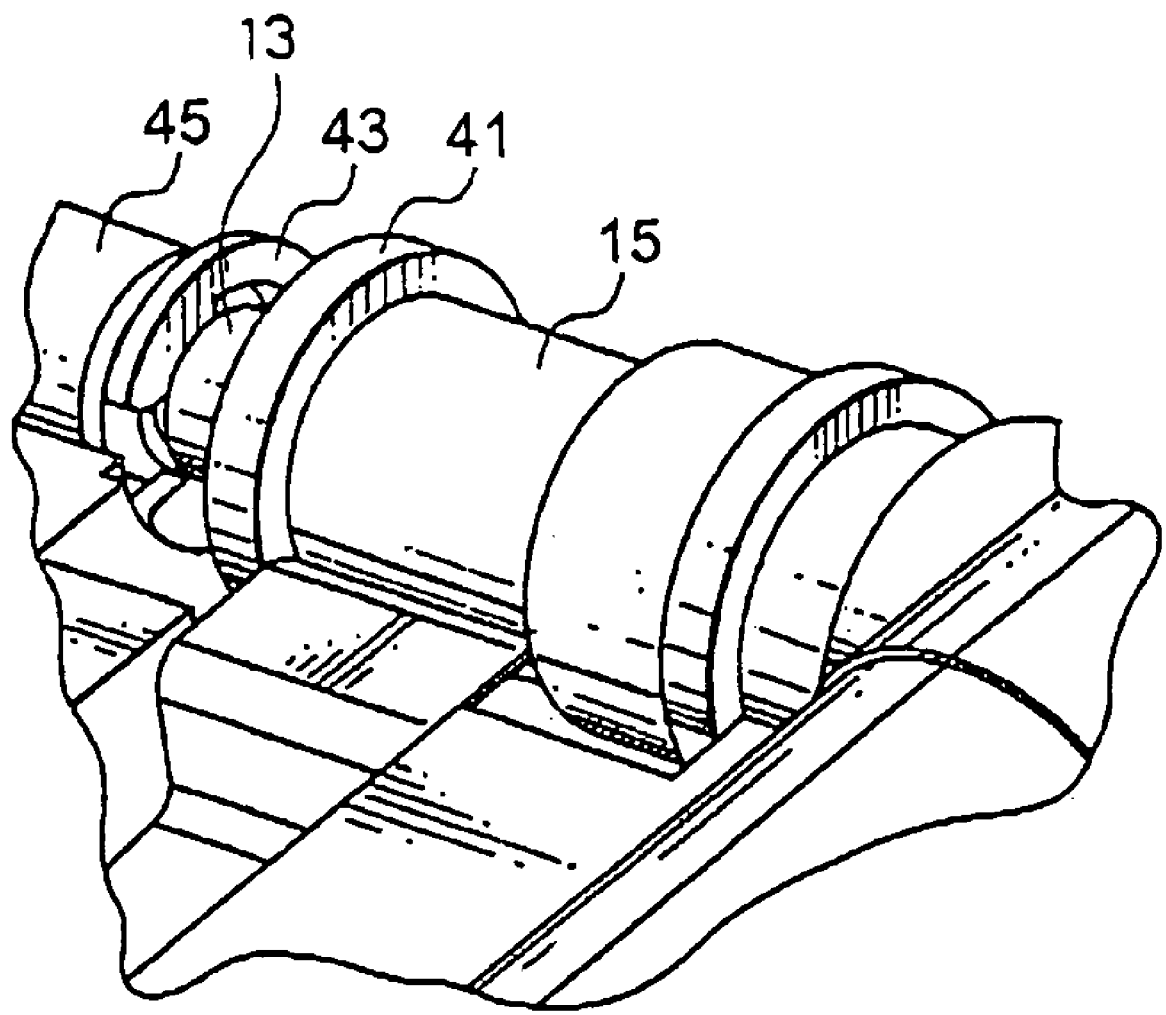
FIG. 14 is an enlarged perspective view of a characteristic part in FIG. 13.

Referring to FIGS. 13 and 14, the flexible board 15 and the second shaft 13 are disposed on the second lower case 53b. The flexible board 15 is wound around the second shaft 13.

The above-mentioned electronic apparatus may be a portable telephone, a PDA (Personal Data Assistant), a note-book-type personal computer, and a video camera, each of which has a two-axis hinge mechanism.

While the present invention has thus far been described in connection with the preferred embodiment thereof, it will readily be possible for those skilled in the art to put this invention into practice in various other manners.

What is claimed is:

1. A hinge connector comprising:
   a shaft member; and
   a flexible board coupled to the shaft member,
   the shaft member comprising:
   a first shaft extending in a first direction; and
   a second shaft extending from the first shaft in a second direction perpendicular to the first direction,
   the flexible board having first and second winding portions which are wound around and fixed to the first and the second shafts, respectively,
   the hinge connector further comprising:
   a cover member attached to the shaft member, the cover member having a pair of cover components, the cover components being attached to the first and the second shafts from opposite sides and forming the cover member in cooperation,
   first and second holding members rotatably coupled to the cover member, one of the first and the second holding members covering the first winding portion and having a slit allowing communication between the inside and the outside, the flexible board extending through the slit of the one, and
   a third holding member rotatably coupled to the cover member, the third holding member covering the second winding portion and having a slit allowing communication between the inside and the outside, the flexible board extending through the slit of the third holding member.

2. The hinge connector according to claim 1, wherein the first shaft has opposite end portions spaced from each other in the first direction and an intermediate portion between the opposite end portions, the second shaft extending from the intermediate portion so that the shaft member has a T shape.

3. The hinge connector according to claim 1, wherein the cover member extends along the second shaft and fitted to the third holding member.

4. An electronic apparatus comprising the hinge connector according to claim 1, further comprising first and second housings hinge-coupled by the hinge connector, the first and the second holding members being engaged with the first and the second housings in a rotating direction thereof.

* * * * *